United States Patent
Ting et al.

(10) Patent No.: US 9,437,541 B2
(45) Date of Patent: *Sep. 6, 2016

(54) PATTERNING APPROACH TO REDUCE VIA TO VIA MINIMUM SPACING

(71) Applicant: Taiwan Semiconductor Manufacturing Company, Ltd., Hsin-Chu (TW)

(72) Inventors: Chih-Yuan Ting, Taipei (TW); Chung-Wen Wu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/724,718

(22) Filed: May 28, 2015

(65) Prior Publication Data
US 2015/0262934 A1 Sep. 17, 2015

Related U.S. Application Data

(63) Continuation of application No. 14/011,079, filed on Aug. 27, 2013, now Pat. No. 9,048,299.

(60) Provisional application No. 61/778,309, filed on Mar. 12, 2013.

(51) Int. Cl.
| | |
|---|---|
| H01L 21/768 | (2006.01) |
| H01L 23/538 | (2006.01) |
| H01L 23/522 | (2006.01) |
| H01L 21/311 | (2006.01) |
| H01L 23/48 | (2006.01) |
| H01L 23/528 | (2006.01) |

(52) U.S. Cl.
CPC ...... *H01L 23/5226* (2013.01); *H01L 21/31111* (2013.01); *H01L 21/31144* (2013.01); *H01L 21/76802* (2013.01); *H01L 21/76811* (2013.01); *H01L 21/76813* (2013.01); *H01L 21/76816* (2013.01); *H01L 21/76877* (2013.01); *H01L 21/76879* (2013.01); *H01L 21/76898* (2013.01); *H01L 23/481* (2013.01); *H01L 23/528* (2013.01); *H01L 23/5384* (2013.01); *H01L 2924/0002* (2013.01)

(58) Field of Classification Search
CPC ............... H01L 21/76802; H01L 21/76879; H01L 21/76898; H01L 23/5384
USPC .......................................... 257/774; 438/702
See application file for complete search history.

(56) References Cited

U.S. PATENT DOCUMENTS 6,221,759 B1 * 4/2001 Bothra .............. H01L 21/76807
257/E21.579
8,318,598 B2 11/2012 Beyer et al.

FOREIGN PATENT DOCUMENTS

KR 20110081833 A 7/2011

*Primary Examiner* — Daniel Shook
(74) *Attorney, Agent, or Firm* — Slater Matsil, LLP

(57) ABSTRACT

A method for patterning vias in a chip comprises forming a photomask layer including a gap on a patterned hardmask layer including a plurality of trenches and in contact with a uniform layer on a substrate, wherein the gap overlaps with two or more of the trenches. The method further comprises exposing a portion of the uniform layer under the gap using a photo exposure process, etching the exposed portion of the uniform layer with the photomask layer to obtain a plurality of vias extended partially through the substrate, and further etching the vias to obtain corresponding through-substrate vias. Another method comprises patterning a plurality of vias in a plurality of trenches of a hardmask layer on a substrate using a single photo exposure step and a photomask comprising a single gap that overlaps with the trenches.

20 Claims, 6 Drawing Sheets

US 9,437,541 B2

PATTERNING APPROACH TO REDUCE VIA TO VIA MINIMUM SPACING

This application is a continuation application of U.S. patent application Ser. No. 14/011,079, filed on Aug. 27, 2013, entitled "Patterning Approach to Reduce Via to Via Minimum Spacing," which claims priority to U.S. Provisional Application No. 61/778,309, filed on Mar. 12, 2013, and entitled "Patterning Approach to Reduce Via to Via Minimum Spacing," which applications are incorporated herein by reference.

TECHNICAL FIELD

The present invention relates generally to a system and method for semiconductor chip fabrication, and, in particular embodiments, to a patterning approach to reduce via to via minimum spacing.

BACKGROUND

Multiple patterning is a class of technologies for manufacturing integrated circuits (ICs), which is developed for photolithography to enhance feature density (e.g., line density). The simplest case of multiple patterning is double patterning, where a conventional lithography process is enhanced to produce double the expected number of features. Double exposure is one of double patterning. Double exposure is a sequence of two separate exposures of the same photoresist layer. The double exposure technique allows manufacturability of minimum pitch features in a layout that may contain a variety of features. For example, the double exposure can be used to pattern parallel or adjacent trenches in the same layer. An approach for patterning trenches involves a sequence of two separate exposure and etching steps (2P2E) of independent patterns into the same layer, via litho-etch-litho-etch stages. When the sequence is completed, the pattern is a composite of the previously etched sub-patterns. By interleaving the sub-patterns, the pattern density can be increased, where the half-pitch is inversely proportional to the number of sub-patterns used. For example, a 100 nanometers (nm) trench or line pitch pattern can be generated theoretically from interleaving two 200 nm trench pitch patterns.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Vias can be patterned, for example, within a patterned layout of parallel trenches, to add electrical interconnects for ICs or semiconductor chips. The minimum pitch of trenches can be achieved using a double patterning technique, such as a 2P2E sequence. The pitch is the distance that separates two centers (or same side edges) of two or repeated structures (e.g., trench/via center to trench/via center). The minimum via-to-via pitch after development inspection (ADI) is larger than that of trenches ADI due to lithography limitation (e.g., optical resolution). The spacing is the closest measured distance between two features, e.g., between the facing edges of the two separate vias or trenches. The pitch between two vias or trenches can be larger than the spacing between the same two vias or trenches. For example, even for a trench pitch of less than 100 nm, the minimum via-to-via pitch that can be achieved is as about 100 nm. Further, more patterning steps may be needed to achieve a via-to-via spacing that matches that of trenches. For example, a sequence of three separate exposure and etching steps (3P3E) are needed to pattern vias with via-to-via spacing (e.g., of less than 100 nm) that matches that of trenches obtained using 2P2E.

Described herein are embodiments of a patterning approach to reduce via-to-via spacing in chip or IC fabrication. A plurality of vias can be patterned within a layout of parallel trenches. The patterning approach uses a combination or overlay of a hardmask layer (for patterning the trenches) and a photomask to pattern the vias with reduced via-to-via spacing that match the trench spacing, such as below the optical resolution limit (e.g., pitch below 100 nm). The exposure resulting from the overlap between the hardmask trench spacing and the photomask allows matching the via-to-via spacing to the hardmask trench spacing. As a result, a via-to-via pitch can be matched to a trench pitch of less than 100 nm. The patterning approach reduces via-to-via spacing using essentially a single mask patterning step and hence reduces cost in comparison to traditional double (or multiple) patterning approaches. Thus, via-to-via pitch of less than 100 nm can be achieved without double (or multiple) patterning steps. Further, the steps of the patterning approach herein can be combined with conventional or other steps of double (or multiple) patterning to obtain a layout of vias in trenches with different via-to-via pitch, e.g., of both less than 100 nm and greater than 100 nm spacing.

Figure 1A:
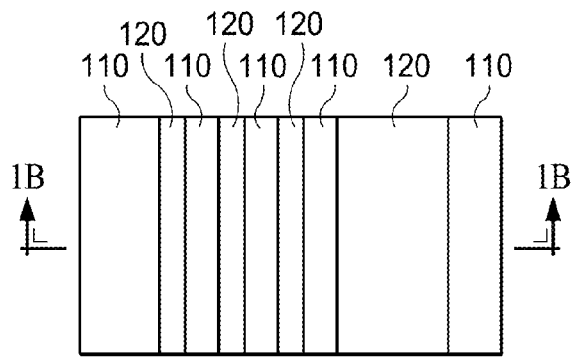
FIGS. 1A through 1H are top views and corresponding cross-sectional views of conventional patterning steps for vias in trenches for a chip structure.
Figure 1B:
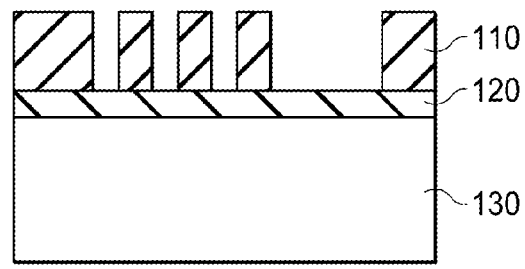

FIGS. 1A through 1H show top views and corresponding cross-sectional views of conventional patterning steps for vias in trenches for a chip structure. The cross-sectional views for each step are shown below their respective top views. FIG. 1A shows a top view of a first step of patterning a hardmask including trenches. FIG. 1B shows a cross-sectional view of the same step. A hardmask layer 110 is patterned over a second layer 120. The hardmask layer 110 can be pattern using conventional lithography processes (e.g., exposure and etch). The hardmask layer 110 is hardmask which comprises multiple equally spaced lines (e.g., mesas) and gaps between the lines (e.g., trenches) with a determined pitch. The hardmask layer 110 is used for patterning lines (e.g., via photo-exposure) in the layer(s) below the hardmask. For example, the hardmask layer 110 may be patterned (or formed) from a layer of titanium nitride (TiN) or any other suitable dielectric. The second layer 120 may be a uniform (un-patterned) layer made of any suitable dielectric (e.g., ceramic). The second layer 120 is deposited on a substrate 130 and serves as an etch stop layer (ESL) between the hardmask layer 110 and the substrate 130. The substrate 130 may be a semiconductor substrate that includes an elementary semiconductor including silicon and/or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAs; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate 130 may be a semiconductor on insulator (SOI). In some examples, the substrate 130 may include a doped epi layer. In other examples, the silicon substrate may include a multilayer compound semiconductor structure. Alternatively, the first substrate may include a non-semiconductor material, such as a glass, fused quartz, or calcium fluoride. In the present example, the substrate 130 includes a silicon wafer. In yet another example, the substrate 130 may also include a dielectric layer (e.g., a low-k film), a conducting layer (e.g., a gate electrode or a metal line), or combinations thereof.

Figure 1C:
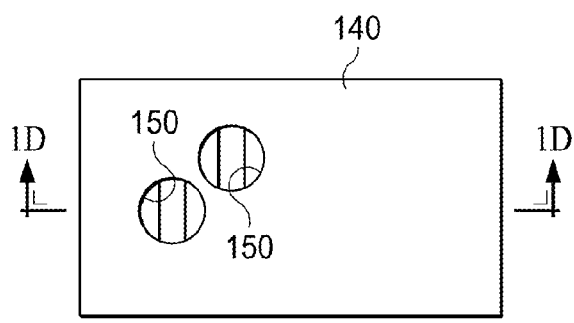
Figure 1D:
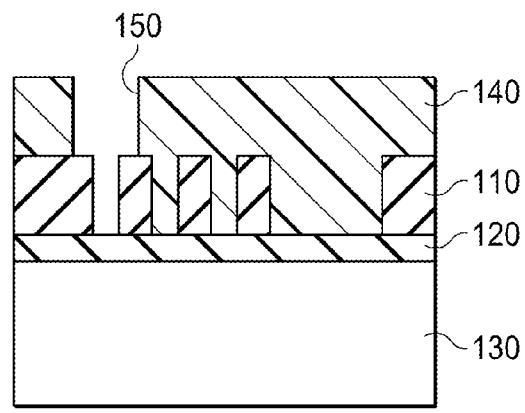

FIG. 1C shows a top view of a second step of patterning a layout of vias using photomask exposure. FIG. 1D shows a cross-sectional view of the same step. In this step, a photomask 140 (e.g., a mask formed of photoresist) can be patterned on top of the hardmask layer 110 and the second layer 120 beneath the trenches of the hardmask layer 110 and includes a plurality of gaps 150. The photomask 140 including the gaps 150 can be patterned using photoresist deposition, exposure (e.g., ultra-violet (UV) exposure), and etch procedures. The resulting patterned photomask 140 may comprise two gaps 150 (e.g., shaped as holes) that overlap respectively with two adjacent trenches in the hardmask layer 110 and the second layer 120 beneath the trenches. The gaps 150 have a separation that determines the via-to-via spacing. The minimum achievable separation is limited by the photolithography process, such as optical resolution (e.g., UV optical resolution), photoresist, etc. Each gap 150 may overlap with a portion of the second layer 120 (in a trench). The edges of the gap 150 may also overlap with one or two lines adjacent to the trench of the hardmask layer 110.

Figure 1E:
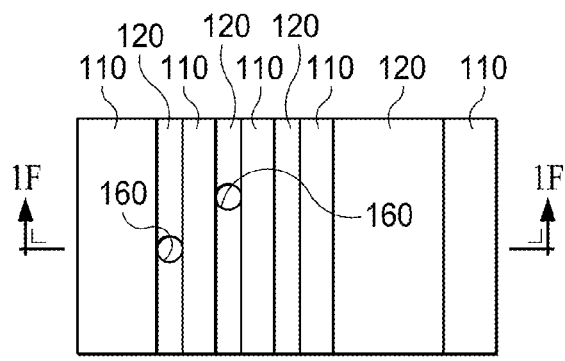
Figure 1F:
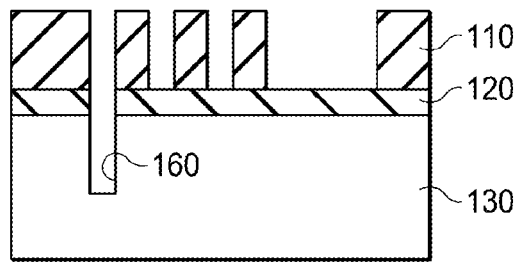

FIG. 1E shows a top view of a third step of etching vias through the second layer 120 and partially through the substrate 130. FIG. 1F shows a cross-sectional view of the same step. An extreme low-k (ELK) etch or any other suitable controlled etch process can be used to etch through the entire layer of the photomask 140 and at the same time through exposed areas of the second layer 120 and partially through the substrate 130 beneath it. The exposed areas of the second layers 120 correspond to the gaps 150 of the photomask 140. The remaining parts of the hardmask layer 110 and the second layer 120 that were covered by the photomask 140 are protected from this etch process and thus do not undergo etching while the photomask 140 is being etched. The resulting etched areas of the second layer 120 and partially the substrate 130 beneath it form partial vias 160 that do not extend through the entire depth of the substrate 130. Two partial vias 160 are obtained where the two gaps 150 were patterned in the photomask 140. Thus, the separation between the partial vias 160 is equal to the separation of the gaps 150, which is limited by the photolithography process.

Figure 1G:
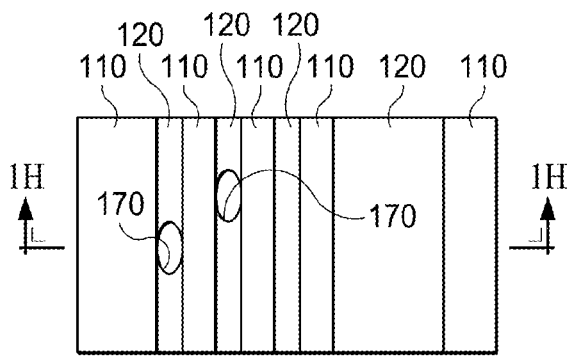
Figure 1H:
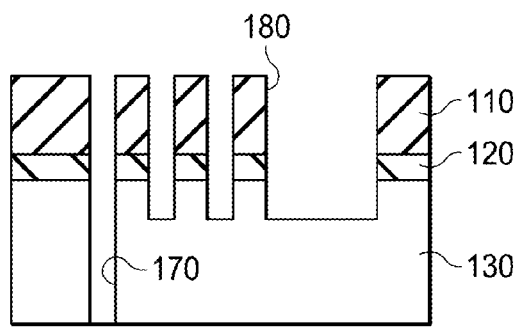

FIG. 1G shows a top view of a fourth step of etching vias and trenches through the substrate 130. FIG. 1H shows a cross-sectional view of the same step. Any suitable controlled etch process (e.g., chemical etch) can be used to complete etching the partial vias 160 through the entire depth of the substrate 130 and hence obtain the through-substrate vias 170. Simultaneously, the trenches in the hardmask layer 110 are etched to extend through the second layer 120 and partially through the substrate 130 to achieve in-substrate trenches 180.

Figure 2:
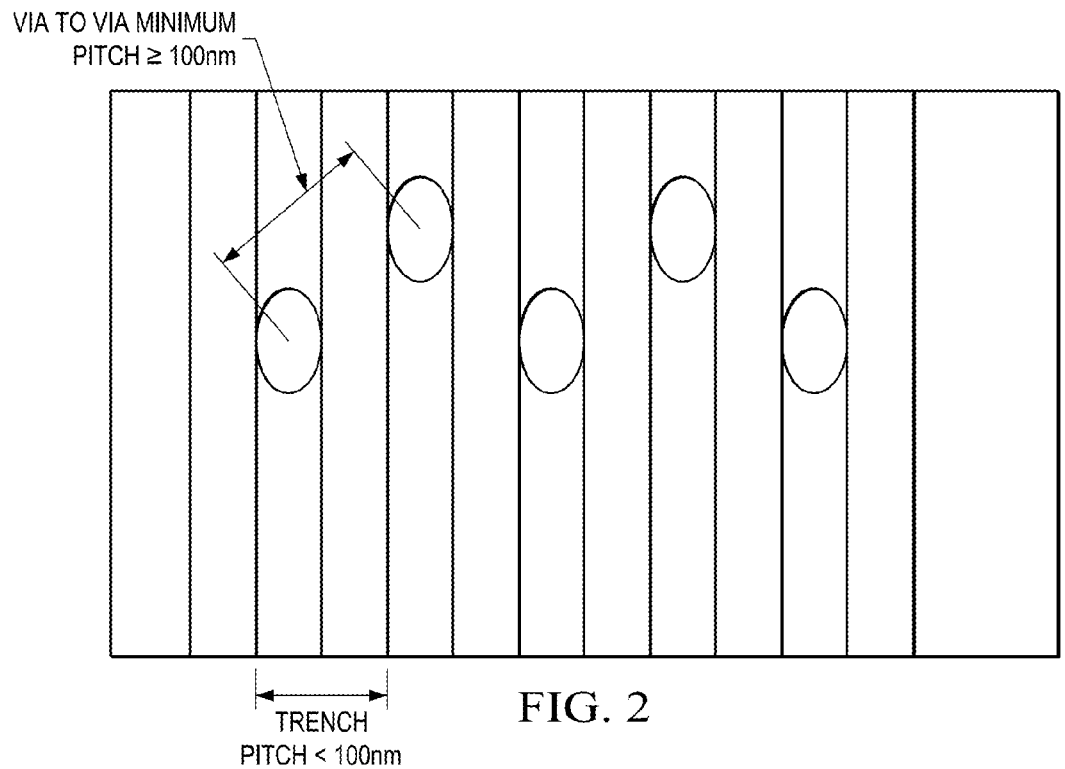
FIG. 2 is a top view of a conventional pattern of vias in trenches for a chip structure.

FIG. 2 shows a conventional pattern of vias in trenches that can be obtained for a chip structure using conventional patterning steps for vias in trenches, such as shown in FIGS. 1A-1H. The minimum pitch of trenches can be reduced to less than about 100 nm using double patterning (e.g., 2P2E), for example with UV lithography and ELK etch. However, the minimum vi-to-via pitch remains limited to about 100 nm or greater, e.g., due to optical resolution. Additional multiple patterning steps (e.g., 3P3E) can help reduce the via-to-via spacing but also increase fabrication cost and complexity.

FIGS. 3A through 3I show top views and cross-sectional views of embodiment patterning steps for vias in trenches for a chip structure. The cross-sectional views for the steps are shown below their respective top views. A last step is only shown in cross-sectional view. This embodiment patterning method allows reducing the via-to-via spacing to match the trench spacing using single mask patterning for vias. As such, the via-to-via spacing can match the trench spacing without using multiple patterning processes for vias. For example, the via-to-via pitch may be reduced using the single mask patterning method or steps to match a trench pitch of less than 100 nm without using 3P3E steps.

Figure 3A:
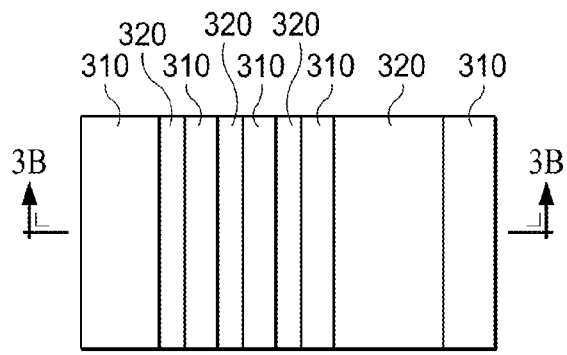
FIGS. 3A through 3I are top views and cross-sectional views of embodiment patterning steps for vias in trenches for a chip structure.
Figure 3B:
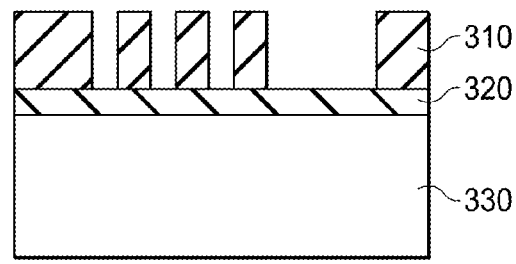

FIG. 3A shows a top view of a first step of patterning a hardmask of trenches. FIG. 3B shows a cross-sectional view of the same step. This step is similar to the first step in FIGS. 1A and 1B. The step includes patterning a hardmask layer 310 (e.g., using exposure, etch, and other suitable lithography processes) over a second layer 320. The hardmask layer 310 comprises multiple equally spaced lines (e.g., mesas) with a determined pitch on top of a uniform second layer 320. The gaps between the lines form trenches in the hardmask layer 310. The hardmask layer 310 and the second layer 320 may be any suitable dielectrics, as described above, and serves as an ESL. The trench pitch may be less than 100 nm, for example using a double patterning approach of interleaving two trench patterns of equal pitch (e.g., less than 200 nm) on the same hardmask layer 310.

Figure 3C:
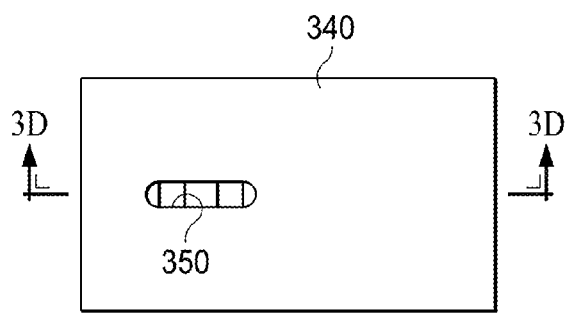
Figure 3D:
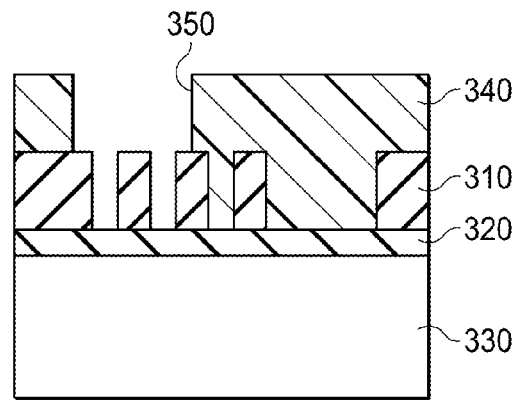

FIG. 3C shows a top view of a second step of patterning a layout of vias using photomask exposure. FIG. 3D shows a cross-sectional view of the same step. In this step, a photomask 340 (e.g., a mask formed of photoresist) can be patterned on top of the hardmask layer 310 and the second layer 320 beneath it using photoresist deposition, exposure (e.g., UV exposure), and etch processes to pattern one or more elongated gap 350 in the photomask 350. The resulting patterned photomask 340 comprises an elongated gap 350 (e.g., a slit or any other shape) that overlaps with at least two adjacent trenches in the hardmask layer 310 and the second layer 320 beneath the trenches. The elongated gap 350 can have any suitable geometry, such as a slit or an elliptical gap that extends across two adjacent trenches (as shown) or across more than two adjacent trenches. The geometry of the elongated gap 350 determines the exposure pattern of the spots (for forming the vias) in the second layer 320 and subsequently the shape of the resulting vias in the trenches, as described below. The overlap between the elongated gap 350 and the trenches is used to expose areas or spots in the underlying second layer 320 across two (or more) consecutive trenches in the hardmask layer 310 with a separation between the spots that matches the trench pitch. As such, the separation between adjacent exposed spots of the second layer 320 is no longer limited by the photolithography process (e.g., optical resolution and other factors) but by the minimum achievable trench pitch (achieved using 2P2E for example). The exposed spots are transformed in subsequent steps into vias, as described below.

Figure 3E:
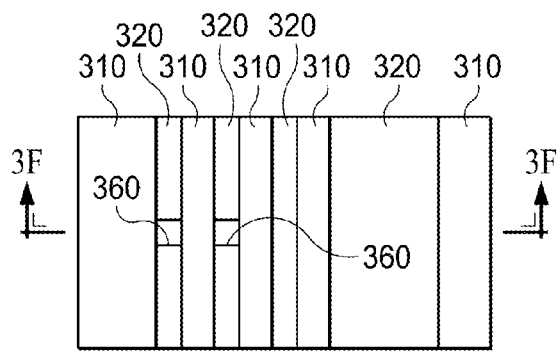
Figure 3F:
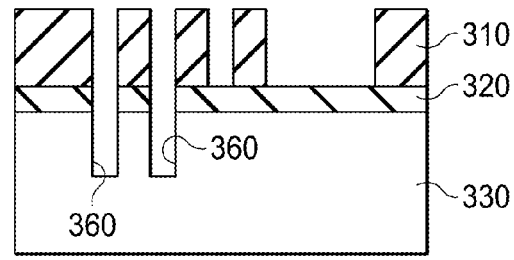

FIG. 3E shows a top view of a third step of etching vias through the second layer 320 and a portion of the substrate 330. FIG. 3F shows a cross-sectional view of the same step. This step is similar to the third step in FIGS. 1E and 1F. The step includes using ELK etch or any other suitable controlled etch process to etch through the entire layer of photomask 340 and at the same the time exposed areas or spots of the second layer 320 and partially through the substrate 330 beneath the exposed spots. Thus, the two (or more) exposed spots of the second layers 320 across two adjacent trenches of the hardmask layer 310 are transformed into two partial vias 360 separated with a via-to-via spacing that matches the trench pitch. As such, a single mask patterning process is used instead of the double (or multiple) patterning process to obtain a via-to-via spacing that matches the trench spacing, which reduces overall fabrication cost, complexity, and possibly time. The double or multiple patterning process can still be used however to reduce the trench pitch.

Figure 3G:
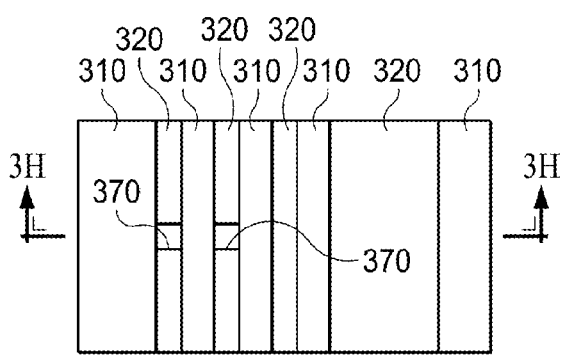
Figure 3H:
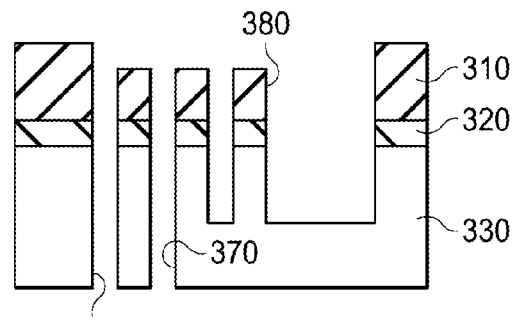
Figure 3I:
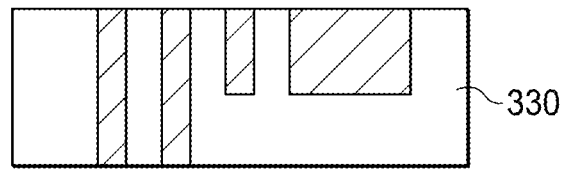

FIG. 3G shows a top view of a fourth step of etching vias and trenches through the substrate 330. FIG. 3H shows a cross-sectional view of the same step. This step is similar to the fourth step in FIGS. 1G and 1H. The step includes using any suitable controlled etch process (e.g., chemical etch) to complete etching the partial vias 360 through the entire depth of the substrate 130 and hence obtain the through-substrate vias 370. Simultaneously, the trenches in the hardmask layer 310 are etched to extend through the second layer 320 and partially through the substrate 330 to achieve in-substrate trenches 380. FIG. 3I shows a cross-sectional view of a last step of filling the through-substrate vias 370 and in-substrate trenches 380 with a conductor or metal 375, such as copper, gold, or aluminum, using any suitable processes (e.g., including sputtering, deposition, and/or etching) to obtain conducting structures or connectors (e.g., vias within metal lines). The hardmask layer 310 and the second layer 320 are also removed, e.g., via etching.

Figure 4:
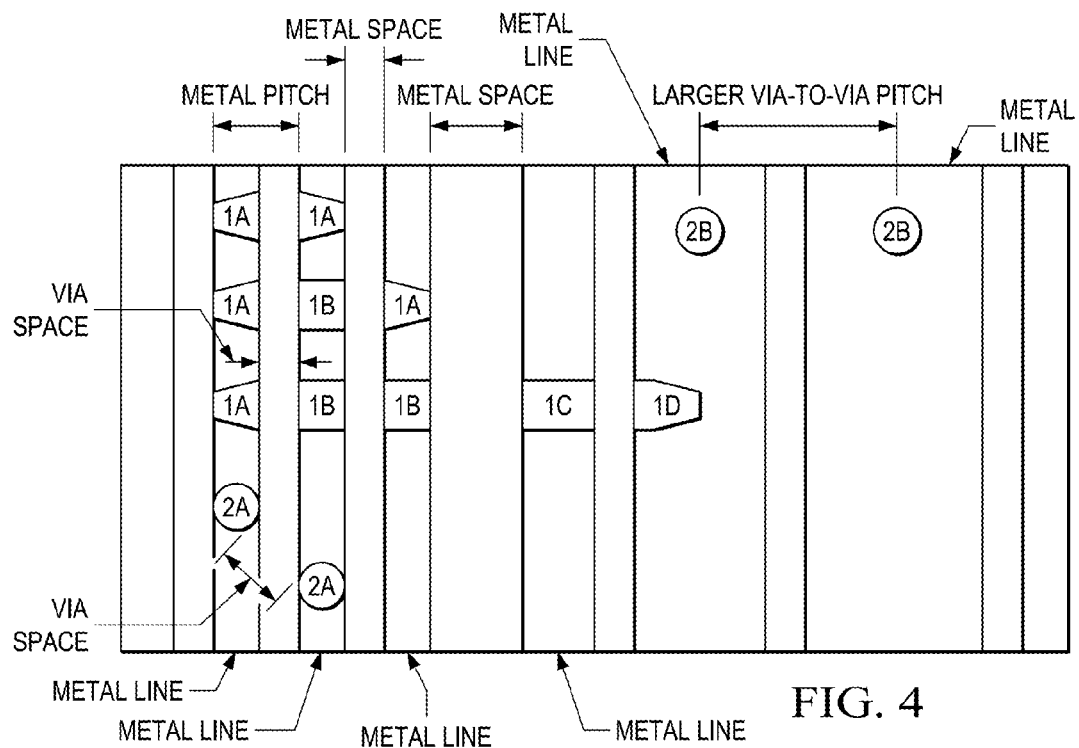
FIG. 4 is a top view of an embodiment pattern of vias in trenches for a chip structure.

FIG. 4 is a top view of an embodiment pattern of vias in trenches for a chip structure. FIG. 4 shows a pattern of vias in metal lines that can be obtained using a combination of the embodiment patterning method or steps shown in FIGS. 3A-3I and conventional patterning steps, such as shown in FIGS. 1A-1H. The pattern includes a plurality of metal lines that have variable metal pitches or separation, including a minimum pitch or spacing. The pattern also includes a plurality of vias in metal lines with different via-to-via separation that match the different metal separations. At least some of the vias are obtained using the single mask patterning approach described above, for instance to match a minimum pitch of less than 100 nm. This approach may be used to match a minimum metal line or metal-to-metal spacing down to about 32 nm, which may be achievable with extreme UV (EUV) lithography and multiple patterning approaches. Other vias that are separated by longer via-to-via spacing are obtained using conventional patterning processes, for example the steps in FIGS. 1A-1H.

Further, vias with different shapes or geometries can be obtained using the single patterning approach. Examples of possible geometries include trapezoid via gaps (labeled 1A), rectangular via gaps (labeled 1B and 1C), and a combination of both (labeled 1D). Further, different pattern types of vias can be combined for a chip structure. A first type of vias (type 1 vias) can be created by splitting a larger via (elongated gap) into two or more vias through trench hard masks, as described above. The type 1 vias can include trapezoid shape vias (1A), rectangular shape vias (1B and 1C), and polygon shape vias (1D). The rectangular via 1C has at least one side width equal to the metal line width. At least one space between the type 1 vias is about equal to the metal-to-metal spacing (trench spacing). A second type of vias (type 2 vias) can also be created by traditional or conventional approaches. The type 2 vias may have a more round shape (e.g., in comparison to the type 1 vias). The type 2 vias can include vias with 100 nm pitch (labeled 2A) and vias with greater than 100 nm pitch (labeled 2B).

The trapezoid vias (1A) correspond to exposed areas or spots resulting from overlap of trenches with edge portions of the elongated gaps in the photomask, which extends across multiple trenches (e.g., the elongated gap 350). The rectangular vias (1B and 1C) correspond to exposed areas or spots resulting from overlap of trenches with middle portions of the elongated gaps. For example, using an elongated gap that extends across three trenches, three adjacent vias in the three adjacent trenches are obtained, which have 1A-1B-1A sequence of shapes (as shown in FIG. 4). The 1C geometry can also be obtained from overlap of a trench with an edge portion of the elongated gap. The other conventionally patterned vias, 2A and 2B, may have a typical hole like geometry.

Figure 5:
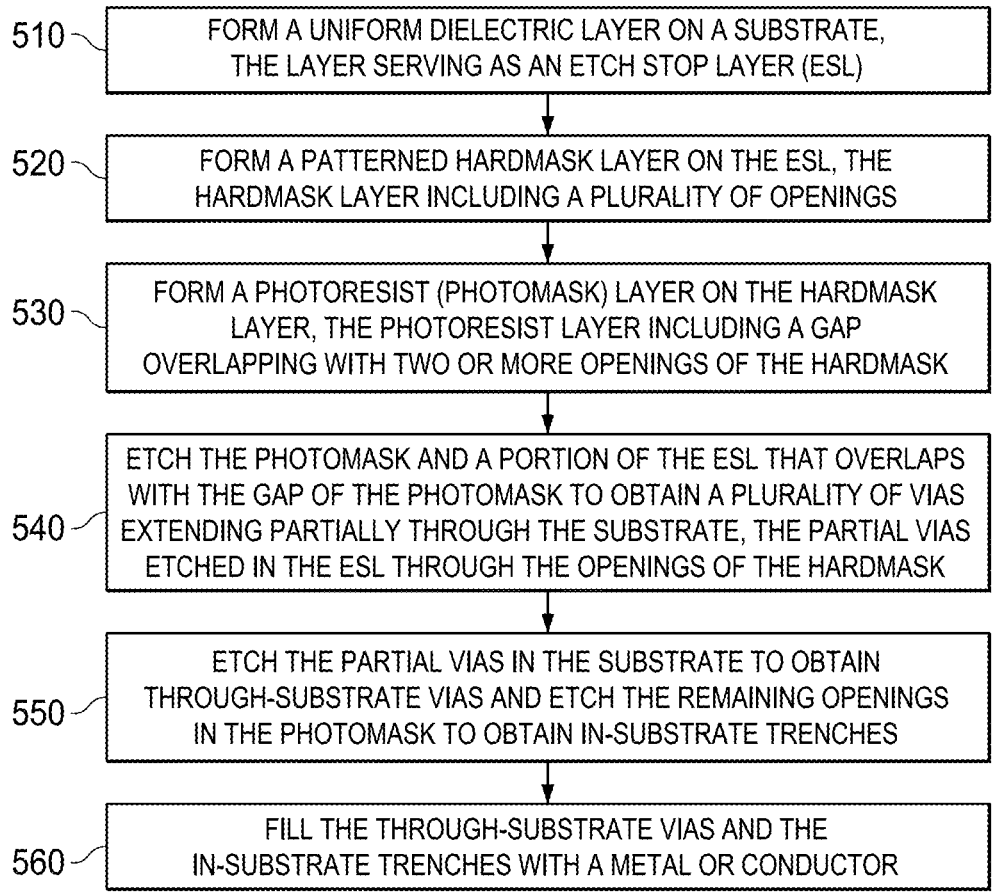
FIG. 5 is a process flow of an embodiment method for patterning vias in trenches for a chip structure.

FIG. 5 shows a process flow of an embodiment method 500 for patterning vias in trenches for a chip structure. The steps of the method 500 may correspond to the top views and cross-sectional views of the steps in FIGS. 3A through 3I. At step 510, a uniform dielectric layer is formed on a substrate. The formed layer serves as an etch stop layer (ESL) in subsequent steps. At step 520, a patterned hardmask layer is formed on the ESL. The hardmask layer includes a plurality of openings via patterning (as shown in FIG. 3B). At step 530, a photoresist (photomask) layer is formed on the hardmask layer. The photoresist layer includes a gap overlapping with two or more openings of the hardmask (as shown in FIG. 3D). At step 540, the photomask layer and a portion of the ESL that overlaps with the gap of the photomask are etched to obtain a plurality of vias extending partially through the substrate (as shown in FIG. 3F). The partial vias are etched in the ESL through the openings of the hardmask. At step 550, the partial vias in the substrate are etched to obtain through-substrate vias. The remaining openings in the photomask are also etched to obtain in-substrate trenches (as shown in FIG. 3H). At step 560, the through-substrate vias and the in-substrate trenches are filled with a metal or conductor (as shown in FIG. 3I).

In accordance with a preferred embodiment of the present invention, a method for patterning vias in a chip comprises forming a photomask layer including a gap on a patterned hardmask layer including a plurality of trenches and in contact with a uniform layer on a substrate, wherein the gap overlaps with two or more of the trenches. The method further comprises exposing a portion of the uniform layer under the gap using a photo exposure process, etching the exposed portion of the uniform layer with the photomask layer to obtain a plurality of vias extended partially through the substrate, and further etching the vias to obtain corresponding through-substrate vias.

In accordance with another preferred embodiment of the present invention, a method for patterning vias in a chip comprises patterning a plurality of vias in a plurality of trenches of a hardmask layer on a substrate using a single photo exposure step and a photomask comprising a single gap that overlaps with the trenches.

In accordance with another preferred embodiment of the present invention, a chip structure comprises a substrate comprising a plurality of trenches and two vias in two respective adjacent trenches, wherein the two vias are patterned using a single photo exposure step with a photomask including a single gap that overlaps with the two adjacent trenches, and wherein the two vias have a via-to-via spacing after development inspection (ADI) that is equal to a pitch ADI of the trenches.

In accordance with another embodiment, a method of forming a semiconductor device is provided. The method includes forming a first mask layer over an underlying layer and forming a first line opening in the first mask layer using a first patterning process. After forming the first line opening, a second line opening is formed in the first mask layer using a second patterning process. A second mask layer is formed over the first mask layer, the second mask layer having a via opening, the via opening exposing portions of the first line opening and the second line opening, and vias are etched in the underlying layer using the first mask layer and the second mask layer as mask. The second mask layer is removed, and after removing the second mask layer, simultaneously etching to extend the vias and to form lines in the underlying layer using the first mask layer as a mask.

In accordance with yet another embodiment, a method of forming a semiconductor device is provided. The method includes forming a first layer over a substrate, forming a second layer over the first layer, patterning the second layer to form a first opening, the first opening exposing the first layer, and after patterning the second layer to form the first opening, patterning the second layer to form a second opening, the second opening exposing the first layer. A third layer is formed over the second layer, and the third layer is patterned to form a combined opening, the combined opening overlapping portions of the first opening and the second opening, the combined opening exposing the first layer. A first portion of the first layer and the substrate is etched through the combined opening to obtain first recesses extending into the substrate. The third layer is removed, and after removing the third layer, the first layer and the substrate is etched to extend the first opening and the second opening into the substrate and to extend the first recesses in the substrate to forms vias and lines in the substrate.

In accordance with yet still another embodiment, a device is provided. The device includes a substrate, a dielectric layer over the substrate, a first conductive element in the dielectric layer, and a second conductive element in the dielectric layer. A first via is under the first conductive element; and a second via is under the second conductive element, wherein a first via-to-via distance between the first via and the second via is less than a minimal spacing allowed by a single patterning step.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. A method of forming a semiconductor device, the method comprising:
    forming a first mask layer over an underlying layer;
    forming a first line opening in the first mask layer using a first patterning process;
    after forming the first line opening, forming a second line opening in the first mask layer using a second patterning process;
    forming a second mask layer over the first mask layer, the second mask layer having a via opening, the via opening exposing portions of the first line opening and the second line opening;
    etching vias in the underlying layer using the first mask layer and the second mask layer as mask;
    removing the second mask layer; and
    after removing the second mask layer, simultaneously etching to extend the vias and to form lines in the underlying layer using the first mask layer as a mask.

2. The method of claim 1, wherein a distance between the first line opening and the second line opening is less than a minimal spacing allowed by a single patterning step.

3. The method of claim 1, wherein the second mask layer comprises a photoresist.

4. The method of claim 1, further comprising removing the first mask layer and filling the vias and lines with a conductive material.

5. The method of claim 1, wherein the underlying layer comprises an etch stop layer over a dielectric layer.

6. The method of claim 5, wherein the forming the first line opening and the forming the second line opening exposes the etch stop layer.

7. The method of claim 6, wherein the etching vias comprises etching vias through the etch stop layer and into the dielectric layer.

8. The method of claim 1, wherein top views of the vias have a trapezoid geometry.

9. A method of forming a semiconductor device, the method comprising:
    forming a first layer over a substrate;
    forming a second layer over the first layer;
    patterning the second layer to form a first opening, the first opening exposing the first layer;
    after patterning the second layer to form the first opening, patterning the second layer to form a second opening, the second opening exposing the first layer;
    forming a third layer over the second layer;
    patterning the third layer to form a combined opening, the combined opening overlapping portions of the first opening and the second opening, the combined opening exposing the first layer;
    etching a first portion of the first layer and the substrate through the combined opening to obtain first recesses extending into the substrate;
    removing the third layer; and
    after removing the third layer, etching the first layer and the substrate to extend the first opening and the second opening into the substrate and to extend the first recesses in the substrate to forms vias and lines in the substrate.

10. The method of claim 9, wherein a distance between the first opening and the second opening is less than a minimal spacing allowed by a single patterning step.

11. The method of claim 10, further comprising removing the first layer and the second layer and filling the vias and lines in the substrate with a conductive material.

12. The method of claim 11, wherein the substrate comprises a dielectric layer, the vias and lines being formed in the dielectric layer.

13. The method of claim 9, wherein top view of the first via has a trapezoid geometry.

14. The method of claim 9, wherein the third layer comprises a photoresist.

15. A device comprising:
a substrate;
a dielectric layer over the substrate;
a first conductive element in the dielectric layer;
a second conductive element in the dielectric layer;
a first via under the first conductive element; and
a second via under the second conductive element;
wherein a first via-to-via distance between the first via and the second via is less than a minimal spacing allowed by a single patterning step.

16. The device of claim 15, wherein the first conductive element is a first line and the second conductive element is a second line.

17. The device of claim 16, wherein the first via-to-via distance is equal to a line-to-line distance between the first line and the second line.

18. The device of claim 15, wherein top views of the first via and the second via have a trapezoid geometry.

19. The device of claim 15 further comprising:
a third via positioned below a third line in the dielectric layer; and
a fourth via positioned below a fourth line in the dielectric layer,
wherein a via-to-via pitch between the third via and the fourth via is larger than or equal to a minimal spacing allowed by a single patterning step.

20. The device of claim 15, wherein a distance between the first conductive element and the second conductive element is less than a resolution limit of ultra violet (UV) or extreme UV (EUV).

* * * * *